(12) United States Patent
Thacker et al.

(10) Patent No.: US 9,082,808 B2
(45) Date of Patent: Jul. 14, 2015

(54) BATCH PROCESS FOR THREE-DIMENSIONAL INTEGRATION

(75) Inventors: Hiren D. Thacker, San Diego, CA (US); Ashok V. Krishnamoorthy, San Diego, CA (US); John E. Cunningham, San Diego, CA (US)

(73) Assignee: ORACLE INTERNATIONAL CORPORATION, Redwood Shores, CA (US)

( * ) Notice: Subject to any disclaimer, the term of this patent is extended or adjusted under 35 U.S.C. 154(b) by 55 days.

(21) Appl. No.: 13/489,401

(22) Filed: Jun. 5, 2012

(65) Prior Publication Data

US 2013/0320567 A1 Dec. 5, 2013

(51) Int. Cl.
*H01L 23/48* (2006.01)
*H01L 23/00* (2006.01)
*H01L 25/065* (2006.01)
*H01L 25/00* (2006.01)

(52) U.S. Cl.
CPC ............... *H01L 24/72* (2013.01); *H01L 24/94* (2013.01); *H01L 25/0652* (2013.01); *H01L 25/0657* (2013.01); *H01L 25/50* (2013.01); H01L 24/13 (2013.01); H01L 24/14 (2013.01); H01L 24/16 (2013.01); H01L 24/26 (2013.01); H01L 24/32 (2013.01); H01L 24/73 (2013.01); H01L 24/81 (2013.01); H01L 2224/131 (2013.01); H01L 2224/13009 (2013.01); H01L 2224/13116 (2013.01); H01L 2224/13147 (2013.01); H01L 2224/14181 (2013.01); H01L 2224/16145 (2013.01); H01L 2224/26145 (2013.01); H01L 2224/26175 (2013.01); H01L 2224/32145 (2013.01); H01L 2224/72 (2013.01); H01L 2224/73204 (2013.01); H01L 2224/81005 (2013.01); H01L 2224/81203 (2013.01); *H01L 2224/81815* (2013.01); *H01L 2224/83191* (2013.01); *H01L 2224/92125* (2013.01); *H01L 2224/94* (2013.01); *H01L 2225/06513* (2013.01); *H01L 2225/06531* (2013.01); *H01L 2225/06534* (2013.01); *H01L 2225/06541* (2013.01); *H01L 2225/06562* (2013.01); *H01L 2924/37001* (2013.01)

(58) Field of Classification Search
CPC .................. H01L 2924/00; H01L 2924/0002; H01L 2224/32225; H01L 21/78; H01L 2224/73265
USPC ........................................................ 257/777
IPC ... H01L 2224/48247, 2224/32225, 2224/48227, H01L 2224/73265, 2924/00
See application file for complete search history.

(56) References Cited

U.S. PATENT DOCUMENTS 7,838,424 B2 * 11/2010 Karta et al. .................. 438/689
2012/0069230 A1 * 3/2012 Takagi et al. ................ 348/294

(Continued)

*Primary Examiner* — Tony Tran
(74) *Attorney, Agent, or Firm* — Park, Vaughan, Fleming & Dowler LLP; Steven E. Stupp (57) ABSTRACT

A chip package is described which includes a first chip having a first surface and first sides having a first side-wall angle, and a second chip having a second surface and second sides having a second side-wall angle, which faces and is mechanically coupled to the first chip. The chip package is fabricated using a batch process, and the chips in the chip package were singulated from their respective wafers after the chip package is assembled. This is accomplished by etching the first and second side-wall angles and thinning the wafer thicknesses prior to assembling the chip package. For example, the first and/or the second side walls can be fabricated using wet etching or dry etching. Therefore, the first and/or the second side-wall angles may be other than vertical or approximately vertical.

8 Claims, 10 Drawing Sheets

(56) References Cited

U.S. PATENT DOCUMENTS

| | | | |
|---|---|---|---|
| 2012/0184083 A1* | 7/2012 | Shimoyama et al. | 438/433 |
| 2012/0313224 A1* | 12/2012 | Fukuda et al. | 257/622 |
| 2013/0277865 A1* | 10/2013 | Teh et al. | 257/782 |

* cited by examiner

BATCH PROCESS FOR THREE-DIMENSIONAL INTEGRATION

GOVERNMENT LICENSE RIGHTS

This invention was made with Government support under Agreement No. HR0011-08-9-0001 awarded by DARPA. The Government has certain rights in the invention.

BACKGROUND

1. Field

The present disclosure generally relates to the design of a chip package. More specifically, the present disclosure relates to the design of a chip package that facilitates batch-processed, three-dimensional integration.

2. Related Art

As integrated-circuit (IC) technology continues to scale to smaller critical dimensions, it is increasingly difficult for existing inter-chip connections to provide suitable communication characteristics, such as: high bandwidth, low power, reliability and low cost. For example, as the operating frequencies continue to increase, it is difficult to maintain the performance of interconnects between conventional individually packaged chips that are connected to a printed circuit board. As a consequence, engineers are researching alternative chip-packaging technologies.

One chip-packaging technology that has been proposed to address this problem is a multi-chip module (MCM) in which mechanically and electrically coupled chips are arranged in a three-dimensional (3D) structure. For example, chips in different layers in the 3D structure may be electrically coupled using dense inter-chip connections, with a pitch between neighboring pads on the order of 10-100 μm.

However, the dense interconnects and the multiple components in the MCM can pose additional packaging challenges. In particular, in order to achieve high-bandwidth/high-data-rate inter-chip communication, the mechanical alignment between facing chips in the MCM typically needs to be on the same order as the pitch between neighboring pads. It can be challenging to position the chips in the MCM with the required accuracy at high speed, which can adversely impact the cost or the performance of the MCM.

Hence, what is needed is a chip package that does not suffer from the above-described problems.

SUMMARY

One embodiment of the present disclosure provides a chip package to house one or more semiconductor chips. This chip package includes a first chip having a first surface and first sides having a first side-wall angle other than vertical. Moreover, the chip package includes a second chip having a second surface and second sides having a second side-wall angle other than vertical, where the second surface faces the first surface, and the second chip is mechanically coupled to the first chip.

Note that the first side-wall angle may be different than the second side-wall angle. However, in some embodiments the first side-wall angle and the second side-wall angle are approximately the same. For example, the first side-wall angle may be approximately 54.74°, and the second side-wall angle may be approximately 54.74°. Moreover, the first sides and the second sides may be associated with a wet-etching process.

Furthermore, the first chip may be electrically coupled to the second chip by proximity-communication connectors. For example, the proximity-communication connectors may include: capacitive proximity-communication connectors, inductive proximity-communication connectors, conductive proximity-communication connectors, and/or optical proximity-communication connectors. In some embodiments, the first chip and the second chip are electrically coupled using solder.

Additionally, the mechanical coupling may include an underfill material that selectively couples the first surface to the second surface in regions proximate to electrical pads on the first surface and the second surface. For example, the underfill material may include an epoxy.

In some embodiments, the chip package includes one or more dielectric layers disposed on the first surface and/or the second surface. The one or more dielectric layers may exclude chipping damage associated with a singulation process. Stated differently, chipping damage to the one or more dielectric layer associated with a singulation process used on the one or more chips may be significantly reduced relative to a conventional dicing process.

Another embodiment provides another chip package to house one or more semiconductor chips. This other chip package includes a first chip having a first surface and first sides having a first side-wall angle that is approximately vertical, where the first chip includes a first dielectric layer disposed on the first surface, and chipping damage to the first dielectric layer associated with the singulation process is significantly reduced relative to the dicing process. Moreover, the other chip package includes a second chip having a second surface and second sides having a second side-wall angle that is approximately vertical, where the second chip includes a second dielectric layer disposed on the second surface, and chipping damage to the second dielectric layer associated with the singulation process is significantly reduced relative to the dicing process. Furthermore, the second surface faces the first surface, and the second chip is mechanically coupled to the first chip.

Note that the first sides and the second sides are associated with a dry-etching process.

Another embodiment provides a method for singulating chips from a wafer. During this method, pits are etched in dicing lanes on a first surface of the wafer. Then, a second surface of the wafer is polished to reduce a thickness of the wafer, thereby singulating chips from the wafer, where the second surface is on an opposite side of the wafer from the first surface.

Note that the etching may include wet etching, and the chips may have sides with side-wall angles other than vertical (such as approximately) 54.74°. Alternatively, the etching may include dry etching, and the chips may have sides with approximately vertical walls.

BRIEF DESCRIPTION OF THE FIGURES

Note that like reference numerals refer to corresponding parts throughout the drawings. Moreover, multiple instances of the same type of part are designated by a common prefix separated from an instance number by a dash.

DETAILED DESCRIPTION

Embodiments of a chip package and a technique for singulating chips from a wafer are described. This chip package includes a first chip having a first surface and first sides having a first side-wall angle, and a second chip having a second surface and second sides having a second side-wall angle, which faces and is mechanically coupled to the first chip. The chip package is fabricated using a batch process, and the chips in the chip package are singulated from their respective wafers after the chip package is assembled. This is accomplished by etching the first and second side-wall angles and thinning the wafer thicknesses prior to assembling the chip package. For example, the first and/or the second side walls can be fabricated using wet etching or dry etching. Therefore, the first and/or the second side-wall angles may be other than vertical or approximately vertical.

By facilitating batch processing of the chips in the chip package (as opposed to serially integrating one component at a time into the chip package), the fabrication technique may increase manufacturing throughput and yield and, thus, may reduce the manufacturing cost of the chip package. In addition, the fabrication technique may facilitate dense 3-dimensional (3D) batch integration of disparate technology platforms (which are individually optimized), such as semiconductor chips (e.g., CMOS VLSI chips) and non-CMOS components (e.g., silicon photonic components), which is sometimes referred to as 'hybrid integration.'

We now describe embodiments of the fabrication technique. During typical wafer-level fabrication of semiconductor components, several chips are fabricated on a single wafer. Each chip (or die) on the wafer is separated from its neighbors by a small area of silicon called the dicing lane or saw lane. Typically, at the end of the fabrication process, chips are singulated along their dicing lanes using a dicing saw.

Figure 1:
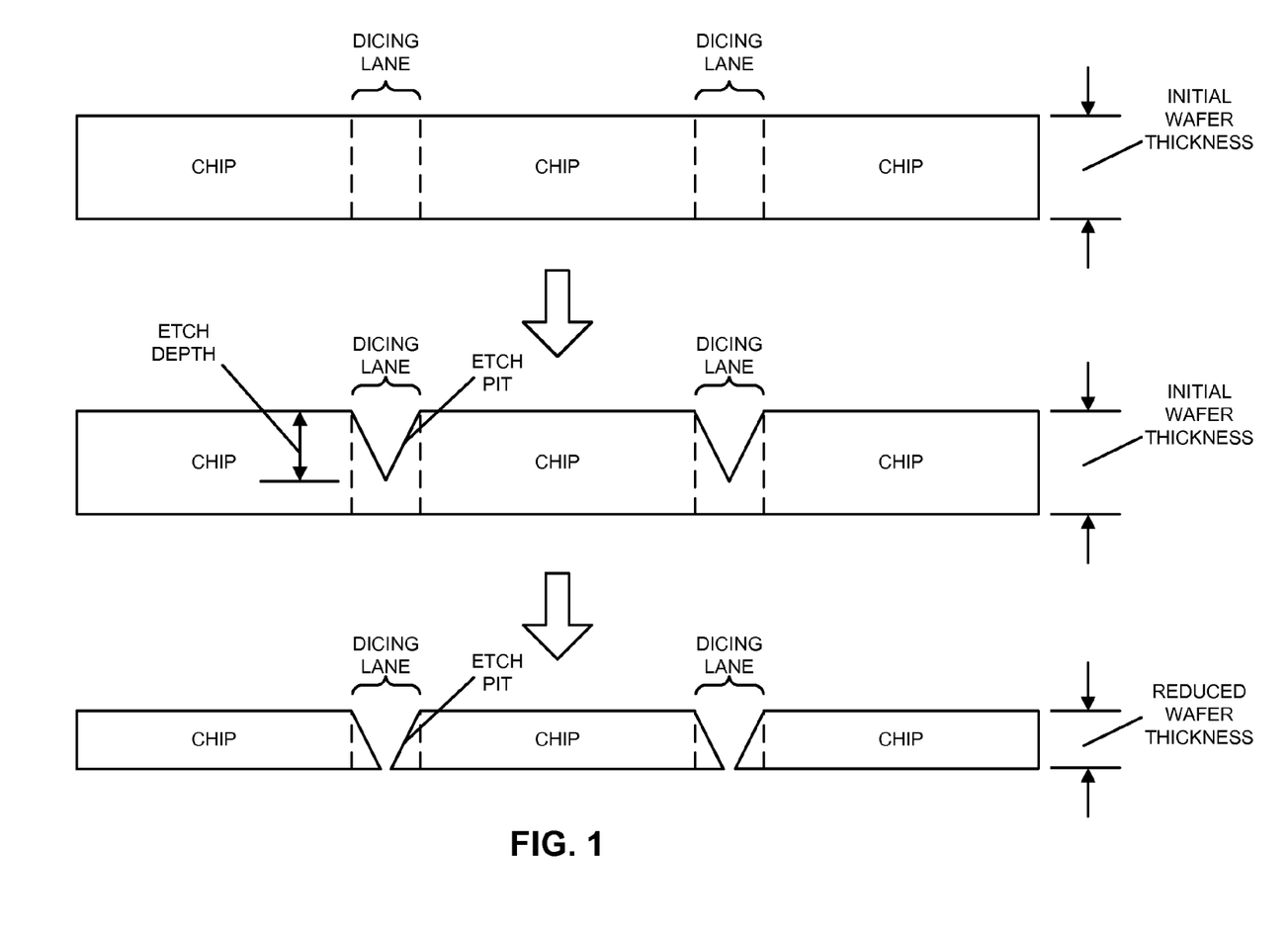
FIG. 1 is a drawing illustrating batch singulation of chips on a wafer using a pit-and-thin technique in accordance with an embodiment of the present disclosure.

FIG. 1, which presents a drawing illustrating batch singulation of chips on a wafer using a pit-and-thin technique, shows an alternative way in which dies on a wafer may be singulated. First, deep pits (or trenches) may be etched in the silicon wafer along the entire length of the allocated dicing lanes, with the pits being shorter than the thickness of the wafer itself. This wafer-level process may be performed as part of the wafer-fabrication flow. Note that the pits may be fabricated using a highly accurate sub-micron resolution lithographic technique, such as those available at any major semiconductor foundry. For example, the trenches may be etched using deep reactive ion etching (DRIE) or anisotropic wet-etching chemistry. In particular, chemicals such as potassium hydroxide (KOH) or tetramethylammonium hydroxide (TMAH) are particularly well suited for the latter as they have very high selectivity to the silicon <111> crystal plane and, therefore, produce pits with side walls angled at 54.74° below the horizontal plane on a <100> wafer.

Figure 2:
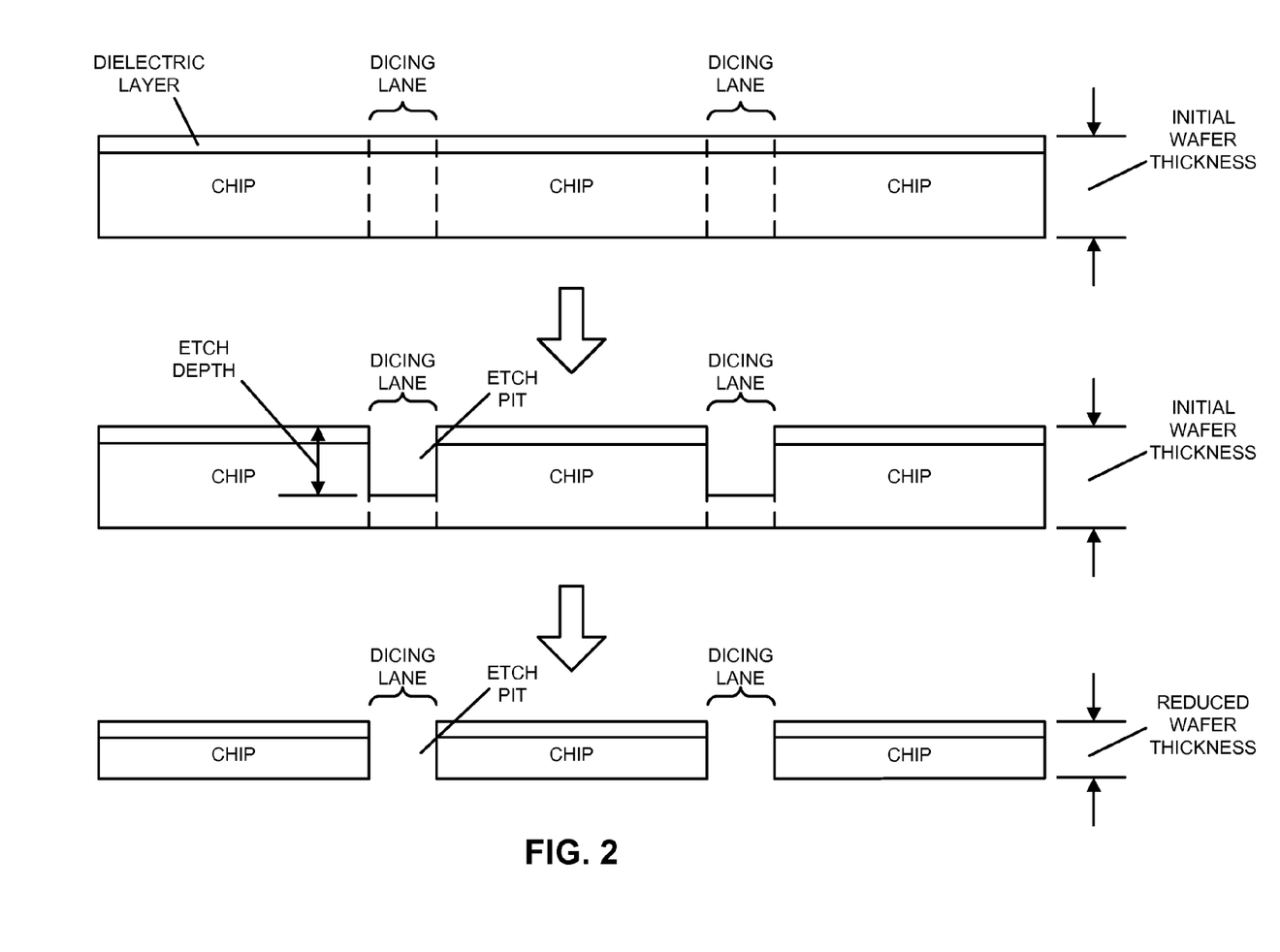
FIG. 2 is a drawing illustrating batch singulation of chips on a wafer using a pit-and-thin technique in accordance with an embodiment of the present disclosure.

Alternatively, as noted above, dry etching may be used to fabricate the pits, which may produce pits with side walls angled within a few degrees of 90° below the horizontal plane on a <100> wafer (i.e., the chips or die may have sides with approximately vertical walls). This is illustrated in FIG. 2, which presents a drawing illustrating batch singulation of chips on a wafer using the pit-and-thin technique. Note that dry etching may be used after a dielectric layer has been deposited or disposed on the wafer.

After the pits have been fabricated using the technique illustrated in FIG. 1 or FIG. 2, the wafer may be thinned from the backside to simultaneously singulate every die on the wafer. For example, the wafer may be thinned using chemical mechanical polishing.

Figure 3:
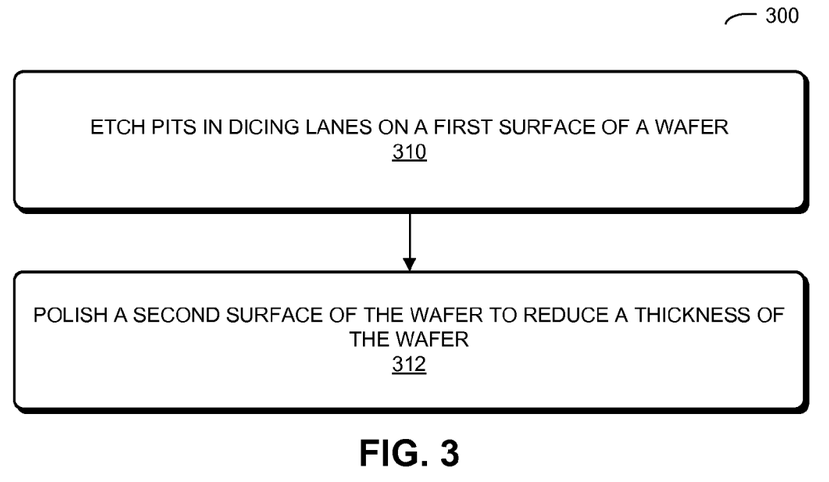
FIG. 3 is a flow chart illustrating a method for singulating chips from a wafer in accordance with an embodiment of the present disclosure.

This pit-and-thin technique is summarized in FIG. 3, which presents a flow chart illustrating a method 300 for singulating chips from a wafer. During this method, pits are etched in dicing lanes on a first surface of the wafer (operation 310). Then, a second surface of the wafer is polished to reduce a thickness of the wafer (operation 312), thereby singulating chips from the wafer, where the second surface is on an opposite side of the wafer from the first surface.

In some embodiments of method 300, there are additional or fewer operations. Moreover, the order of the operations may be changed, and/or two or more operations may be combined into a single operation.

Figure 4:
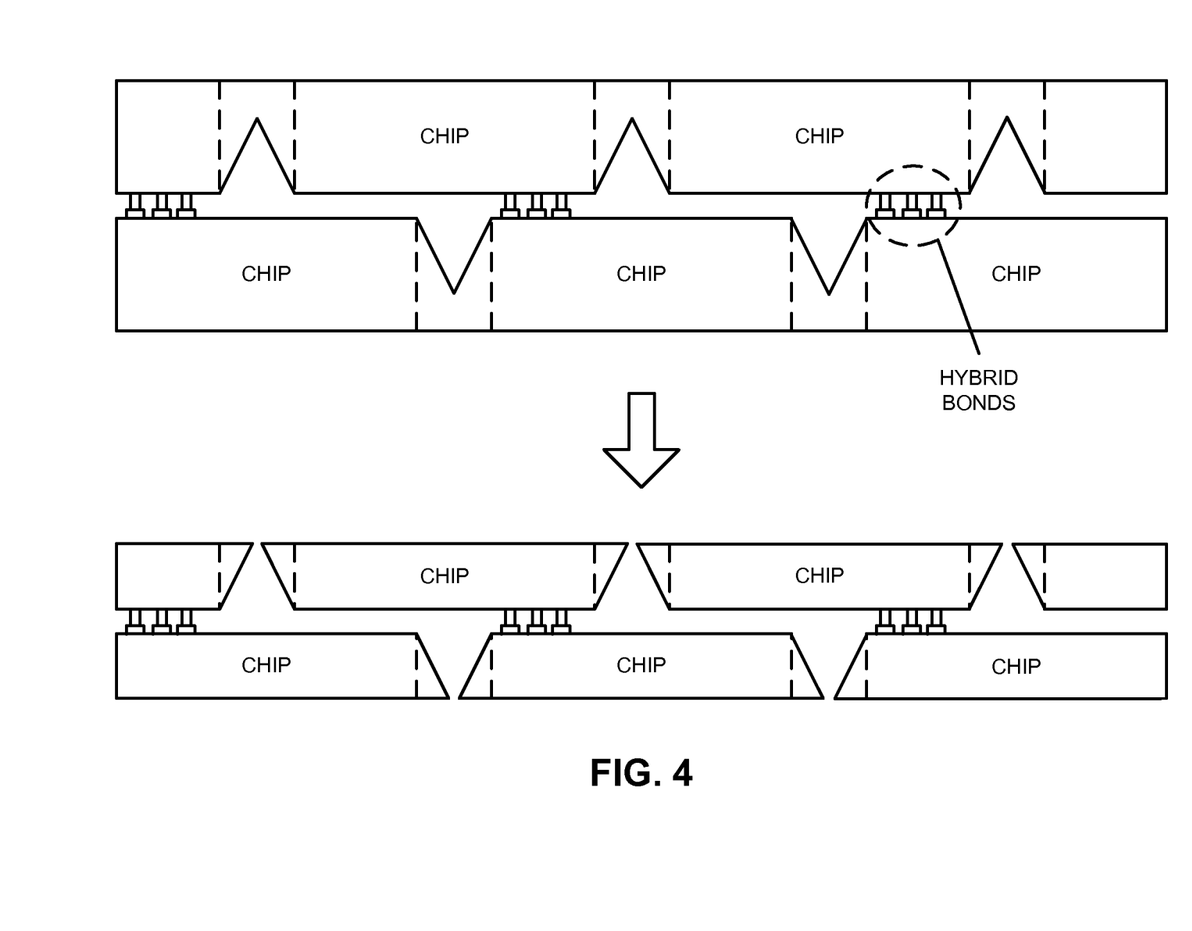
FIG. 4 is a drawing illustrating a process flow for batch integration in accordance with an embodiment of the present disclosure.

We now describe batch integration using wafers produced using the pit-and-thin technique. Pit-and-thin singulation can be applied to batch integration (including batch hybrid integration). It may be useful in situations when: the sizes of chips to be integrated are not the same; chips are to be assembled in diving board configurations (in which at least one edge of a chip, such as a photonic chip, is sufficiently exposed to provide access for surface-normal input/output or I/O communication, such as edge-coupling optical I/O communication); and/or there is a wafer-size mismatch (i.e., one chip is built on a wafer that is smaller than the other, such as a III-V optoelectronic device chip built on a 3" wafer, or a VLSI chip built on a larger 12" platform). FIG. 4 presents a drawing illustrating a process flow for batch integration. Pits are first etched along the 'dicing' or singulation lanes on both the wafers to be integrated. One or both of these wafers may have chip-to-chip interconnects already fabricated on them, which may also have been performed at the wafer-scale. Examples of these interconnects include microsolder, lead-based or lead-free C4 solder bumps, copper pillars, stud-bumps, etc. (More generally, as described below with reference to FIG. 9, the interconnects may include proximity-communication interconnects.) Integration may be achieved by flip-chip bonding one wafer to the other. Note that the process parameters for the mechanical and/or electrical coupling may depend on the choice of chip-to-chip interconnect, but in general either thermocompression bonding or reflow-bonding techniques may be used with temperatures ranging from room temperature to 350C, and varying pressures. Furthermore, underfill may or may not be used. If underfill is used, then either underfill dams may be used to prevent the underfill from flowing into the pitted/trenched singulation lanes, or the underfill process can be completed after singulation is completed. In this way, the mechanical strength of the chip packages may be selectively increased without strengthening the areas where the chips will need to separate from one another during singulation.

Once the bonding process is complete, the island and bridge wafers (i.e., the facing wafers in the chip package) may be thinned down sequentially (in any order) and sufficiently to reveal the bottom of the pits, thereby separating neighboring chips from each other. Temporary carrier wafers (or tape) may be used to provide mechanical support to the wafers so that the bonded chip-to-chip interconnects remain intact. Note that maximum benefit of this batch-process fabrication technique may be achieved when the bridge and island chips have approximately the same size as the overhead of silicon area (so that the die pitch on an island wafer matches the die pitch on a bridge wafer), and wasted area is minimized. When the chip sizes are too dissimilar, empty silicon area may need to be added and the cost-benefit of this fabrication technique may be mitigated with lost on-wafer real estate. An optimistic scenario is when two maximum reticle-sized dies are to be bonded at the wafer level. In this case, a full reticle for the island chip (e.g., a microprocessor or a switch chip) may be attached to a full reticle bridge chip (e.g., a silicon-on-insulator photonic bridge chip that provides maximal optical bandwidth). As noted above, the fabrication technique may be used to perform hybrid integration (photonic and non-photonic chips) or regular integration (for example, CMOS chips).

The pit-and-thin singulation technique may also be used to thin down one wafer, and a dicing process may be used to separate chips (such as the island chips) on the second wafer (after the two wafers are mechanically coupled or attached). If dicing is used then very precise alignment control may be needed on the dicing saw so that it does not damage the surface of the bonded chip. Such a combination of the pit-and-thin singulation technique on one wafer and dicing of the other wafer may be appropriate if one chip in the bonded pair is smaller than the other chip, and if its footprint is fully contained inside the boundary of the larger chip.

Alternatively, the pit-and-thin singulation technique may be used to thin down one wafer, and a cleaving process may be used to separate chips (such as the island chips) on the second wafer (after the two wafers are mechanically coupled or attached). For example, after bonding the wafers and singulating the chips from the first wafer, and while the second wafer is still sitting on the tape (carrier), a clean break of the chips on the second wafer may be performed, thereby separating the bonded components. Note that this approach may also require that pits or trenches are etched in the singulation lanes on each of the wafers.

Flip-chip bonding processes such as the ones used in the aforementioned batch-integration processes typically require the use of an underfill material between the chips/wafers being bonded. One function of this material is to act as a mechanical buffer if the layers on the wafers being bonded have a large mismatch in their respective coefficients of thermal expansion (CTE). Another role of the underfill material is as an adhesive to promote bonding strength.

In the fabrication technique, there are a few points in the process flow where underfill may be added between the chips, and the choice of these entry points may be determined by their application. Given the proposed pit-and-thin singulation technique, the use of an underfill material that is dispensed on the wafer (or that is dispensed where it is needed using vias) and which has unrestricted flow may be contraindicated because this may complicate the singulation process. For example, such an underfill material may require additional operations to remove underfill in unwanted areas. Instead, if a 'free-flow' underfill is used, then it can be introduced after the integrated components (or chips) have been singulated from their host wafer(s).

A free-flow underfill material may also be introduced in the process after bonding and after one of the wafers has been thinned to reveal the pits, i.e., when the dies on the thinned wafer have been singulated, and there are small gaps between them, but they are still attached to the second wafer because of the bonding. In this case, the free-flow underfill material may be inserted between the chips, and its flow may be controlled by the use of underfill 'dams,' for example, consisting of positive-feature patterns on one wafer that form a restrictive volume after bonding to the mating wafer so that the underfill can be confined.

Another underfill approach is to use a so-called 'no-flow' underfill, i.e., commercially available materials that have a far lower viscosity than 'free-flow' underfills. These underfill materials can be dispensed in a specific pattern over each die on a wafer, and may only flow a controlled amount under the bonding conditions, thereby staying confined in the overlap regions between the bonded chips on the wafers.

In some embodiments, a temporary underfill material is used during fabrication of the chip package. Subsequently, this temporary underfill material may be removed using a solvent or by exposing it to elevated temperature.

Figure 5:
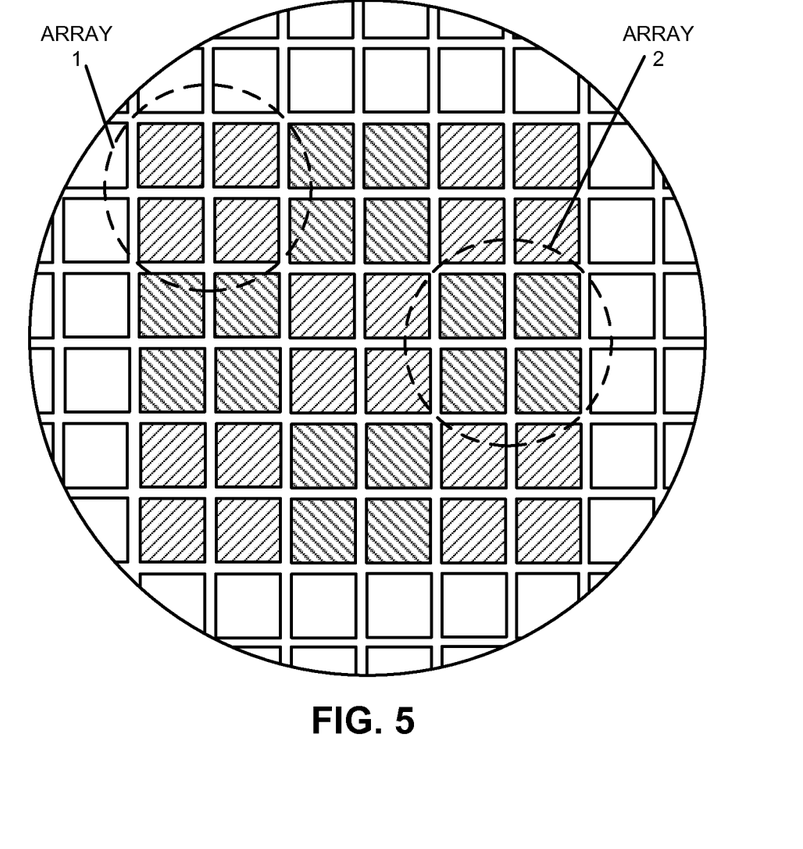
FIG. 5 is a drawing illustrating a batch-integration process in accordance with an embodiment of the present disclosure.

As shown in FIG. 5, which presents a drawing illustrating a batch-integration process, a wafer containing bridge chips is smaller than the wafer containing the island chips. In this embodiment, arrays of bridge-chip wafers may be bonded to the island-chip wafer (for example, using a so-called 'hybrid bond,' in which two chips are joined to each other by a low-parasitic conductive chip-to-chip interconnect). This bonding may be performed sequentially or in parallel. Furthermore, the bridge chips can be separated by thinning the bridge-chip wafer from the backside (note that the pits may be etched on the front-side in the desired singulation lanes as shown in FIGS. 1 and 2).

Figure 6:
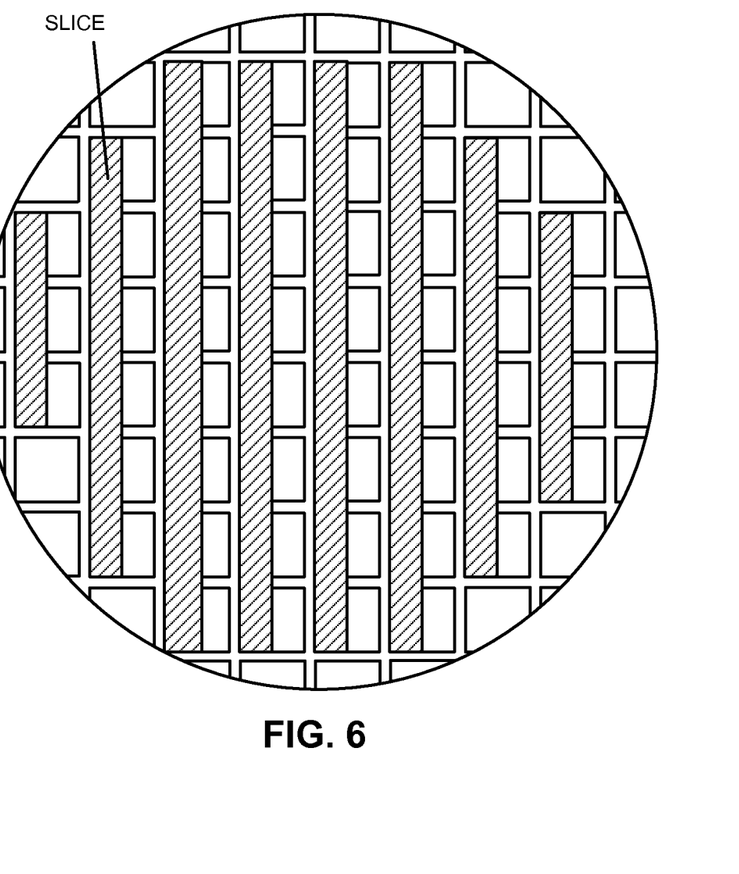
FIG. 6 is a drawing illustrating a batch-integration process in accordance with an embodiment of the present disclosure.

Alternatively, as shown in FIG. 6, which presents a drawing illustrating a batch-integration process, slices of different bridge-chip wafers, containing vector arrays of bridge chips, each with pits in the 'singulation' lanes, may be bonded to an island-chip wafer. After the bonding, the bridge-chip wafer slices may be thinned down from the backside to reveal the pits on the front-side that are etched in the singulation lanes, thereby singulating all the bonded dies in parallel.

Figure 7:
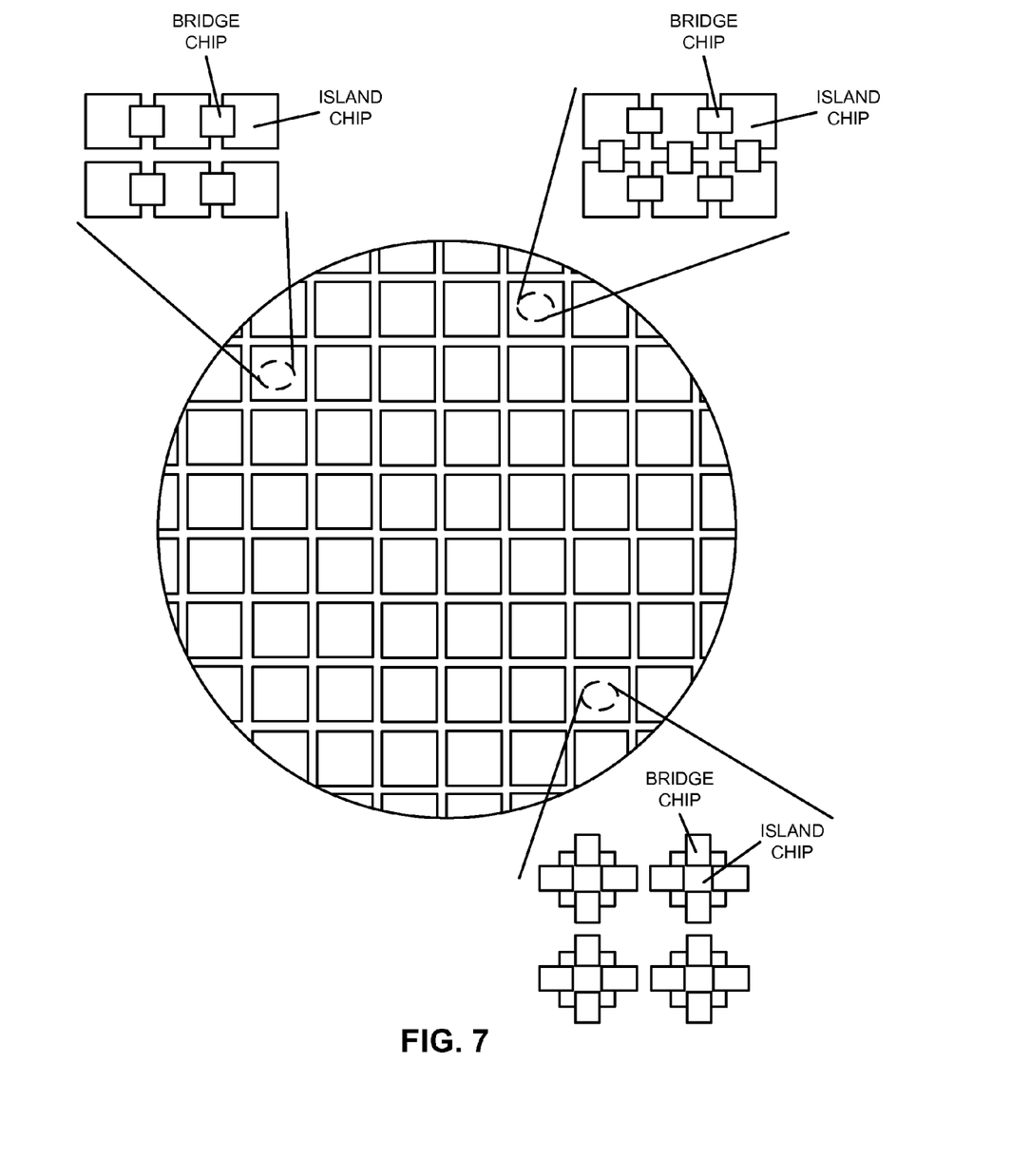
FIG. 7 is a drawing illustrating a batch-integration process in accordance with an embodiment of the present disclosure.

The fabrication technique can be used in a variety of configurations. For example, as shown in FIG. 7, which presents a drawing illustrating a batch-integration process, only one bridge chip may be attached to an island chip, or bridge chips may be attached to two or all the edges of the island chips. Note that proper co-design of the bridge-chip and island-chip wafers may allow the fabrication technique to create 'diving-board components' with bridge chips hanging off of one or all edges of the island chips (at the cost of silicon area).

Figure 8A:
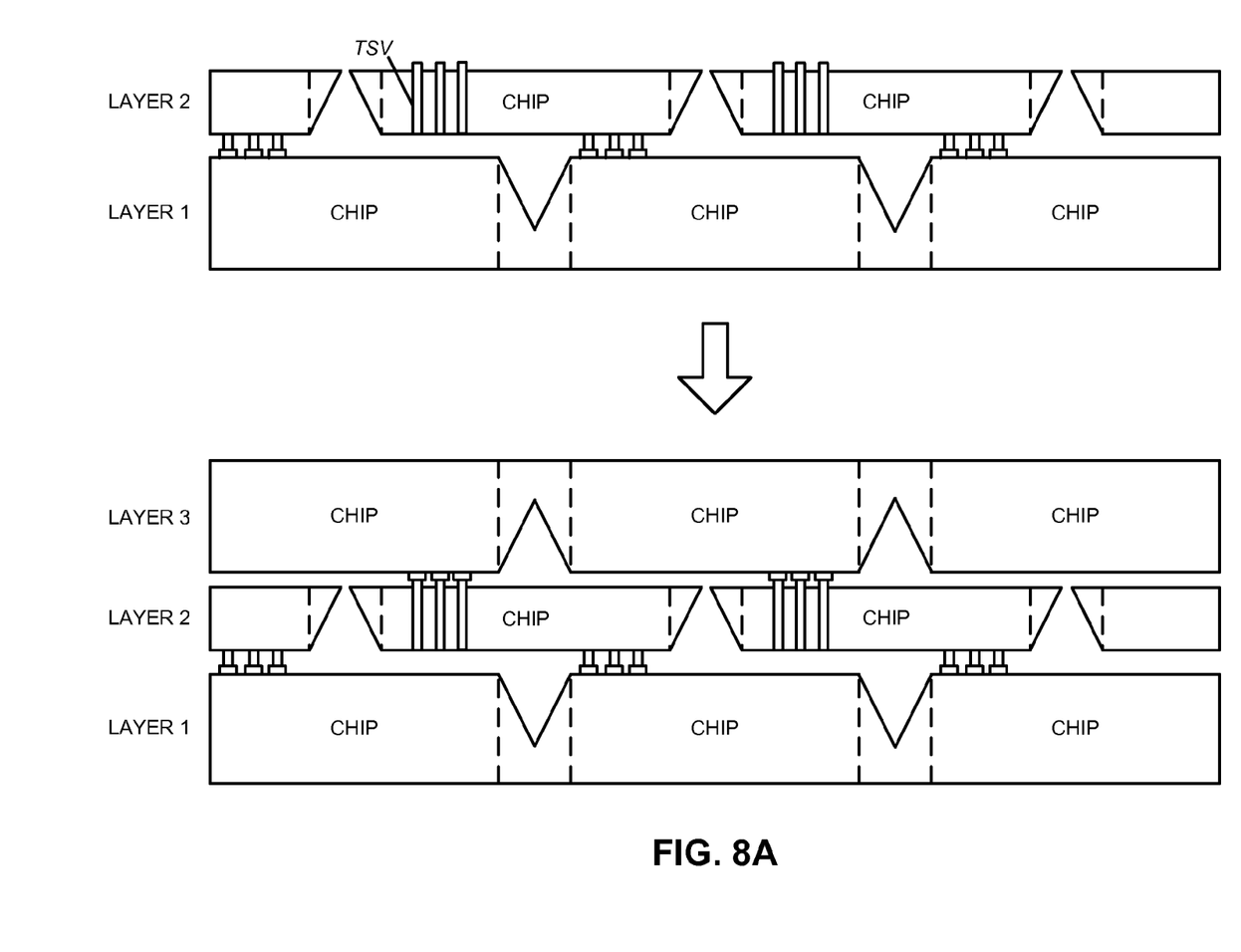
FIG. 8A is a drawing illustrating a process flow for batch integration in accordance with an embodiment of the present disclosure.
Figure 8B:
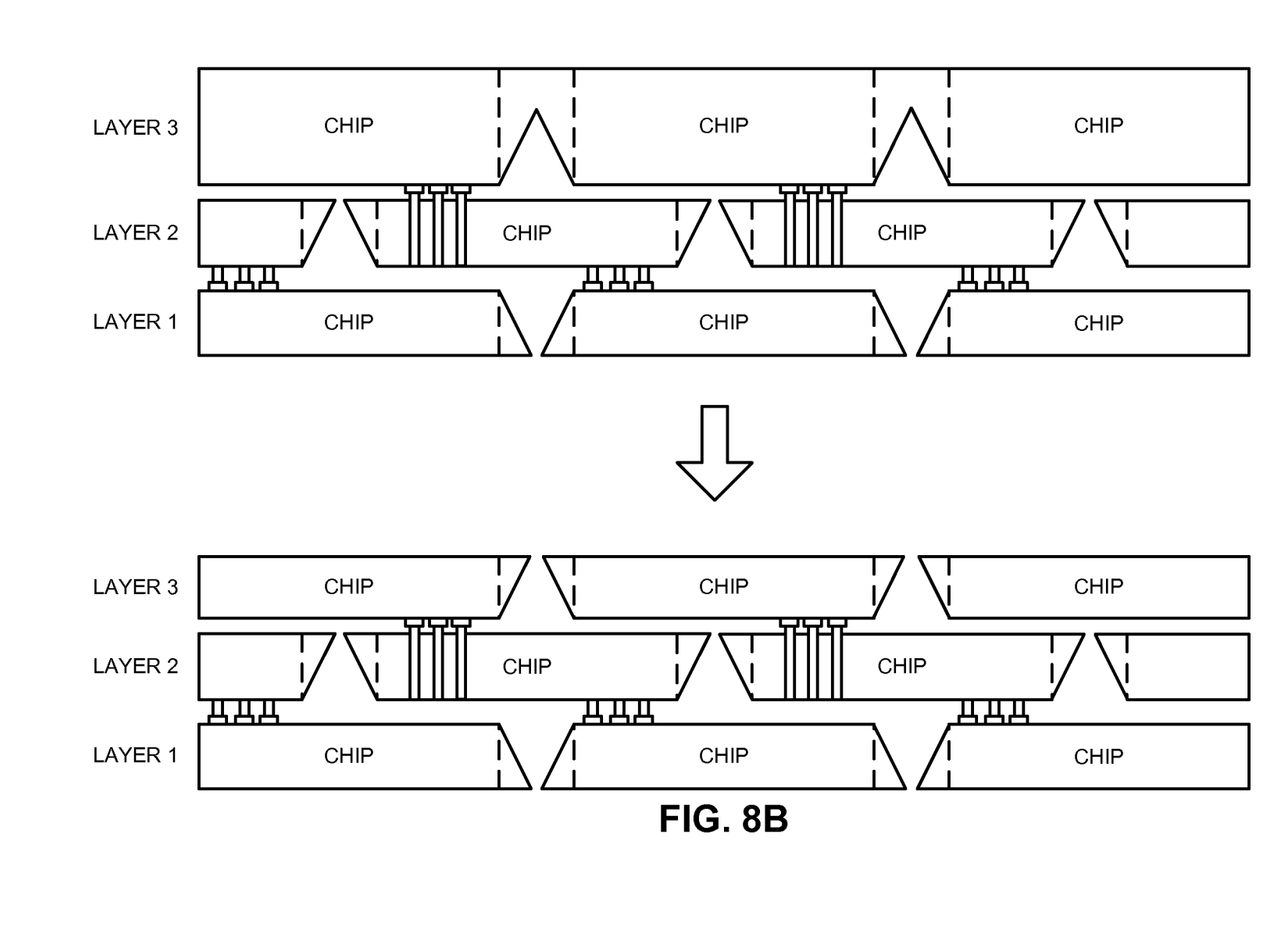
FIG. 8B is a drawing illustrating the process flow for batch integration of FIG. 8A in accordance with an embodiment of the present disclosure.

The batch integration facilitated by the fabrication technique may be extended to build 3D chip stacks using a sequential wafer-stacking process. FIGS. 8A and 8B present a process flow for batch integration of a 3-layer chip stack. First, layer 1 and layer 2 wafers, each with pits/trenches etched along the dicing lanes, may be stacked using the process shown in FIG. 4. The layer-2 chips used in this configuration (which represent an intermediate layer in the 3D stack) may include through-substrate vias (TSVs), i.e., vertical conductive interconnects, that provide conductive paths for signals, power and ground from one side of the layer-2 chip to the other. These TSVs may be fabricated by etching high-aspect ratio blind vias in a silicon substrate and filling them with a conductive material, such as copper. After this operation, the wafers may be thinned from the backside to 'reveal' the TSVs. Note that the copper posts may extend just above the back surface of the substrate, and may provide an interface for subsequent processing or bonding.

In FIG. 8A, the TSVs in the layer-2 chips may be revealed at the same time as the chips are singulated (using the pit-and-thin singulation technique). Subsequent processing may then be performed to prepare these revealed interconnects for bonding to the layer-3 wafer shown in FIG. 8A. After this bonding, layers 1 and 3 may be thinned, thereby resulting in singulation and separation of the chip stacks.

Depending on the chip-to-chip interconnect used to implement the inter-layer connections, as well as the number of interconnects between each chip, an underfill material may be needed to provide mechanical adhesion between the chips in the layers. As noted previously, there are several ways this underfill material may be introduced during the batch-integration flow. For example, a no-flow underfill material may be dispensed on a surface of one wafer (or layer) before bonding it to a second wafer. This approach may ensure that the underfill material does not fill the pitted/trenched dicing lanes, thereby facilitating easier separation of the chips at the end of the fabrication technique. Alternatively, a flowable wafer-level underfill material may be used, but this may require additional operations (such as etching, solvent dissolution, laser ablation, etc.) when separating the completed stacks.

Note that the fabrication technique illustrated in FIGS. 8A and 8B is not limited to three wafers or layers. In principle, the process may be continued for multiple additional wafers or layers. In addition, note that any of the layers in the stack may consist of several wafers bonded to a host wafer (as illustrated in FIGS. 5 and 6).

The aforementioned singulation pits may co-exist with other types of functional pits on the surfaces of the wafers. For example, the singulation pits may be used in conjunction with other front-side pits (which may not be as deep as the singulation pits) for passive alignment of the bridge and island chips (e.g., ball and pit alignment) and/or other purposes (e.g., optical proximity communication). Furthermore, the singulation pits may be used in conjunction with backside etch pits in the bridge chips in order to thermally isolate photonic devices in the bridge chips.

Figure 9:
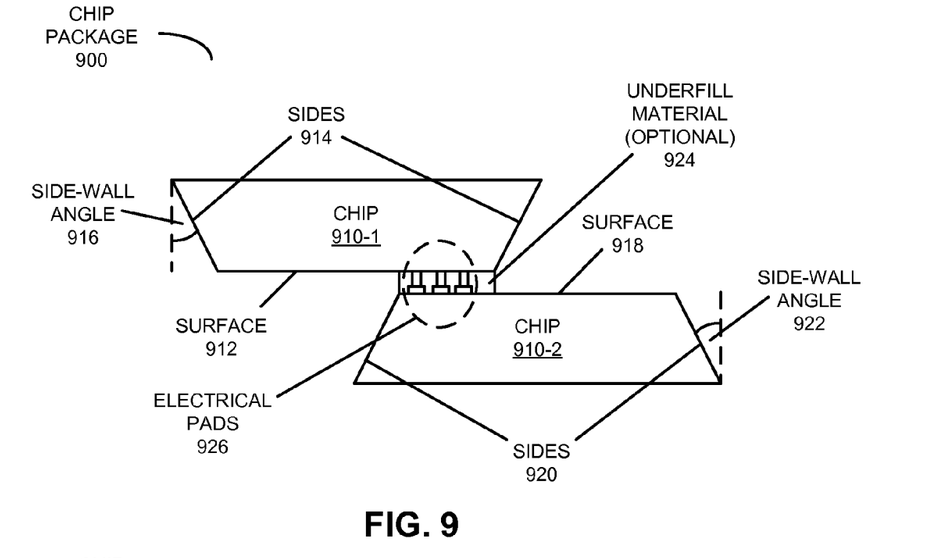
FIG. 9 is a block diagram illustrating a chip package that includes chips fabricated using the pit-and-thin technique of FIG. 1 in accordance with an embodiment of the present disclosure.

We now further describe chip packages that include chips fabricated using the pit-and-thin technique of FIGS. 1 and 2. FIG. 9 presents a block diagram illustrating a chip package 900 that includes chips fabricated using the pit-and-thin technique of FIG. 1. This chip package houses one or more semiconductor chips 910. In particular, chip package 900 includes chip 910-1 having surface 912 and sides 914 having side-wall angle 916 other than vertical. Moreover, chip package 900 includes chip 910-2 having surface 918 and sides 920 having side-wall angle 922 other than vertical, where surface 918 faces surface 912, and chip 910-2 is mechanically coupled to chip 910-1.

Note that side-wall angle 916 may be different than side-wall angle 922. However, in some embodiments side-wall angles 916 and 922 are approximately the same. For example, side-wall angle 916 may be approximately 54.74°, and side-wall angle 922 may be approximately 54.74°. Thus, sides 914 and 920 may be associated with a wet-etching process.

Furthermore, as noted previously, chip 910-1 may be electrically coupled to chip 910-2 by proximity-communication connectors (such as electrical pads 926). For example, the proximity-communication connectors may include: capacitive proximity-communication connectors, inductive proximity-communication connectors, conductive proximity-communication connectors, and/or optical proximity-communication connectors. In some embodiments, chips 910 are electrically coupled using solder.

In an exemplary embodiment, chips 910 are bonded using a hybrid bond. For example, a silicon photonic bridge chip (such as chip 910-2) may be hybrid bonded to at least a pair of VLSI chips (such as chip 910-1). These hybrid bonds may provide conductive connections that embody an electrical interface for local communications and optical access for global interconnections via either optical fiber or optical waveguides on another routing layer in the chip package. As noted previously, a photonic bridge chip may be assembled in diving-board configuration, such that at least one edge of the photonic chip is sufficiently exposed to provide access for surface-normal or edge-coupling optical I/O communication.

Additionally, the mechanical coupling may include an optional underfill material 924 that selectively couples surface 912 to surface 918 in regions proximate to electrical pads 926 on surfaces 912 and 918. For example, optional underfill material 924 may include an epoxy.

Figure 10:
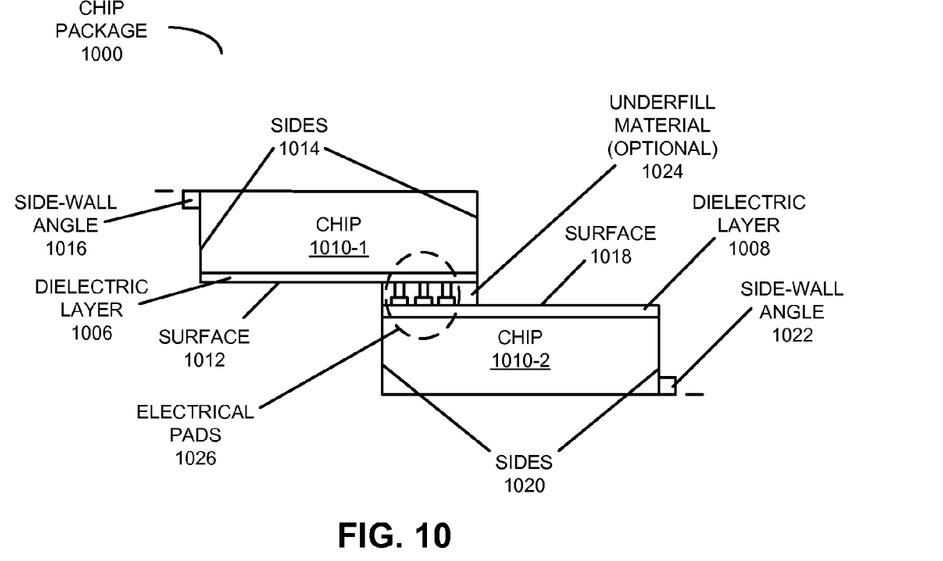
FIG. 10 is a block diagram illustrating a chip package that includes chips fabricated using the pit-and-thin technique of FIG. 2 in accordance with an embodiment of the present disclosure.

FIG. 10 presents a block diagram illustrating a chip package 1000 that includes chips fabricated using the pit-and-thin technique of FIG. 2. This chip package houses one or more semiconductor chips 1010. In particular, chip package 1000 includes chip 1010-1 having surface 1012 and sides 1014 having side-wall angle 1016 that is approximately vertical (for example, within a few degrees of 90°). Moreover, chip package 1000 includes chip 1010-2 having surface 1018 and sides 1020 having side-wall angle 1022 that is approximately vertical. In chip package 1000, surface 1018 faces surface 1012, and chip 1010-2 is mechanically coupled to chip 1010-1.

Furthermore, chip 1010-1 may include a dielectric layer 1006 disposed on surface 1012, and dielectric layer 1006 excludes chipping damage associated with a singulation process (for example, instead of being singulated using a dicing or a cleaving process, chip 1010-1 may have been singulated from a corresponding wafer using the pit-and-thin singulation technique). Additionally, chip 1010-2 may include a dielectric layer 1008 disposed on surface 1018, and dielectric layer 1008 excludes chipping damage associated with the singulation process. Stated differently, chipping damage to dielectric layers 1006 and/or 1008 associated with the pit-and-thin singulation technique may be significantly reduced relative to the dicing process (for example, chipping damage may be reduced by 2, 5 or 10× in spatial frequency and/or magnitude).

This absence of chipping damage in chips 1010 may be in contrast with the back-end-of-line (BEOL) interconnect stack on existing integrated circuits or chips built on advanced process technology nodes that include layers of porous low-k and ultralow-k dielectric materials, thin-film metals, and oxides. As a result, this stack (which may be 6-10 μm thick) is often brittle and fragile. Dicing by traditional means, e.g., with a high-speed saw, may cause the BEOL on existing chips to peel and chip easily. When viewed through a microscope, the edges of a saw-cut wafer may not appear smooth, but discontinuous and fragmented with sharp or rounded nodules. Additionally, the peeled up areas may be easily identified because they appear darker than regions away from the edge where good adhesion is maintained. One of the reasons that existing chips feature 'guard rings' is to prevent delamination and crack propagation into the active circuit area.

Note that sides 1014 and 1020 may be associated with a dry-etching process.

Furthermore, chip 1010-1 may be electrically coupled to chip 1010-2 by proximity-communication connectors (such as electrical pads 1026). For example, the proximity-communication connectors may include: capacitive proximity-communication connectors, inductive proximity-communication connectors, conductive proximity-communication connectors, and/or optical proximity-communication connectors. In some embodiments, chips 1010 are electrically coupled using solder and/or a hybrid bond.

Additionally, the mechanical coupling may include an optional underfill material 1024 that selectively couples surface 1012 to surface 1018 in regions proximate to electrical pads 1026 on surfaces 1012 and 1018. For example, optional underfill material 1024 may include an epoxy.

Embodiments of the chip package may be used in a variety of applications, including: VLSI circuits, communication systems (such as in wavelength division multiplexing), storage area networks, data centers, networks (such as local area networks), and/or computer systems (such as multiple-core processor computer systems). For example, the chip package may be included in a backplane that is coupled to multiple processor blades, or the chip package may couple different types of components (such as processors, memory, input/output devices, and/or peripheral devices). In some embodiments, the chip package performs the functions of: a switch, a hub, a bridge, and/or a router.

Note that the chip package may be included in a system, such as: a server, a laptop computer, a communication device or system, a personal computer, a work station, a mainframe computer, a blade, an enterprise computer, a data center, a portable-computing device, a tablet computer, a cellular telephone, a supercomputer, a network-attached-storage (NAS) system, a storage-area-network (SAN) system, and/or another electronic computing device. Moreover, note that a given computer system may be at one location or may be distributed over multiple, geographically dispersed locations.

The preceding embodiments of the chip package may include fewer components or additional components. For example, in embodiments with non-vertical sidewalls, a chip may include a dielectric layer disposed on its surface, and the dielectric layer may exclude chipping damage associated with a singulation process (or may have significantly reduced chipping damage relative to a conventional dicing process).

Furthermore, although these embodiments are illustrated as having a number of discrete items, these chip packages and systems are intended to be functional descriptions of the various features that may be present rather than structural schematics of the embodiments described herein. Consequently, in these embodiments two or more components may be combined into a single component, and/or a position of one or more components may be changed.

Note that the chips and/or the chip package may be fabricated using an additive or positive process (i.e., a material-deposition process) and/or a subtractive or negative process (i.e., a material-removal process). For example, the process may include: sputtering, plating, isotropic etching, anisotropic etching, a photolithographic technique and/or a direct-write technique. Additionally, these processes may utilize a wide variety of materials, including: a semiconductor, metal, glass, sapphire, an organic material, a ceramic material, a plastic and/or silicon dioxide.

In general, during assembly components in the chip packages may be positioned relative to each other, and mechanically coupled to each other, using a flip-chip process and/or a pick-and-place process. However, in accordance with the disclosed batch fabrication technique, these operations may be performed at the wafer level instead of on a chip-by-chip basis. Furthermore, the mechanical coupling between the components in these embodiments may be rigid (such as that associated with glue or reflowed solder) or may be rematable to facilitate re-work of chip packages.

In the preceding description, we refer to 'some embodiments.' Note that 'some embodiments' describes a subset of all of the possible embodiments, but does not always specify the same subset of embodiments.

The foregoing description is intended to enable any person skilled in the art to make and use the disclosure, and is provided in the context of a particular application and its requirements. Moreover, the foregoing descriptions of embodiments of the present disclosure have been presented for purposes of illustration and description only. They are not intended to be exhaustive or to limit the present disclosure to the forms disclosed. Accordingly, many modifications and variations will be apparent to practitioners skilled in the art, and the general principles defined herein may be applied to other embodiments and applications without departing from the spirit and scope of the present disclosure. Additionally, the discussion of the preceding embodiments is not intended to limit the present disclosure. Thus, the present disclosure is not intended to be limited to the embodiments shown, but is to be accorded the widest scope consistent with the principles and features disclosed herein.

What is claimed is:

1. A chip package to house one or more semiconductor chips, comprising:
   a first trapezoidal chip having a first surface and outer sides having a first side-wall angle other than vertical; and a
   second trapezoidal chip having a second surface and outer sides having a second side-wall angle other than vertical, wherein the second surface faces the first surface; and
   wherein the second chip is mechanically coupled to the first chip using multiple hybrid bonds in parallel, wherein one end of the hybrid bonds is coupled to the first surface of the first chip, and the other end of the hybrid bonds is coupled to the second surface of the second chip, wherein the second chip is coupled to the first chip in diving-board configuration, and wherein at least one edge of the second chip is used to provide optical access for global interconnections, wherein a triangular trench is formed by an outer side of the first trapezoidal chip and an outer side of a chip adjacent to the first trapezoidal chip on a wafer, and wherein the first trapezoidal chip and the chip adjacent to the first trapezoidal chip are separable by thinning down the wafer;
   wherein the first side-wall angle is approximately 54.74°; and wherein the second side-wall angle is approximately 54.74°; and
   wherein the second trapezoidal chip has a third face on an opposite side of the second face, wherein the chip package further comprises a third trapezoidal chip having a fourth face and outer sides having a third side-wall angle other than vertical, wherein the fourth face faces the third face, and wherein the third chip is coupled to the second chip in diving-board configuration.

2. The chip package of claim 1, wherein the first side-wall angle is different than the second side-wall angle.

3. The chip package of claim 1, wherein the outer sides of the first and the second chips are associated with a wet-etching process.

4. The chip package of claim 1, wherein the first chip is electrically coupled to the second chip by proximity-communication connectors.

5. The chip package of claim 4, wherein the proximity-communication connectors include one of: capacitive proximity-communication connectors, inductive proximity-communication connectors, conductive proximity-communication connectors, and optical proximity-communication connectors.

6. The chip package of claim 1, wherein the first chip and the second chip are electrically coupled using solder.

7. The chip package of claim 1, wherein the mechanical coupling includes an underfill material, wherein the underfill material is only dispensed in the overlap region between the first chip and the second chip; and wherein the underfill material selectively couples the first surface to the second surface in regions proximate to electrical pads on the first surface and the second surface.

8. The chip package of claim 7, wherein the underfill material includes an epoxy.

* * * * *

UNITED STATES PATENT AND TRADEMARK OFFICE
CERTIFICATE OF CORRECTION

PATENT NO.         : 9,082,808 B2                             Page 1 of 1
APPLICATION NO.    : 13/489401
DATED              : July 14, 2015
INVENTOR(S)        : Thacker et al.

It is certified that error appears in the above-identified patent and that said Letters Patent is hereby corrected as shown below:

In the Specification
In column 2, line 50, delete "approximately) 54.74°." and insert -- approximately 54.74°). --, therefor.

Signed and Sealed this
Twenty-first Day of June, 2016

Michelle K. Lee
*Director of the United States Patent and Trademark Office*